(12) United States Patent
Lee

(10) Patent No.: US 7,515,495 B2
(45) Date of Patent: Apr. 7, 2009

(54) ACTIVE CYCLE CONTROL CIRCUIT AND METHOD FOR SEMICONDUCTOR MEMORY APPARATUS

(75) Inventor: Sang-Kwon Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 230 days.

(21) Appl. No.: 11/647,435

(22) Filed: Dec. 29, 2006

(65) Prior Publication Data

US 2007/0189096 A1     Aug. 16, 2007

(30) Foreign Application Priority Data

Feb. 10, 2006    (KR) .................... 10-2006-0012814

(51) Int. Cl.
 *G11C 7/00* (2006.01)
(52) U.S. Cl. ...................... 365/222; 365/229
(58) Field of Classification Search ............... 365/222, 365/229, 194
See application file for complete search history.

(56) References Cited

U.S. PATENT DOCUMENTS

| | | | |
|---|---|---|---|
| 5,430,680 A | 7/1995 | Parris | |
| 6,137,743 A * | 10/2000 | Kim | 365/222 |
| 6,414,894 B2 * | 7/2002 | Ooishi et al. | 365/222 |
| 6,587,918 B1 | 7/2003 | Christenson | |
| 6,735,140 B1 | 5/2004 | Fiscus et al. | |
| 6,765,839 B2 * | 7/2004 | Park | 365/222 |
| 7,009,898 B2 | 3/2006 | Lee et al. | |
| 2005/0036378 A1 | 2/2005 | Kawaguchi et al. | |
| 2005/0226074 A1 * | 10/2005 | Yang et al. | 365/222 |

FOREIGN PATENT DOCUMENTS

| | | |
|---|---|---|
| JP | 06-275071 | 9/1994 |
| JP | 2005085429 | 3/2005 |
| KR | 1020000043211 | 7/2000 |
| KR | 1020030000842 | 1/2003 |
| KR | 1020060054822 | 5/2006 |

* cited by examiner

*Primary Examiner*—Anh Phung
(74) *Attorney, Agent, or Firm*—Venable LLP; Jeffri A. Kaminski

(57) ABSTRACT

An active cycle control circuit includes a refresh active control signal generation unit that generates a refresh active control signal at the same cycle as a refresh request signal at a timing earlier than the refresh request signal, a refresh standby signal output unit that outputs a refresh standby signal according to a refresh active signal and the refresh request signal, and an active control unit that outputs a row active signal for performing a read cycle according to a read command and outputs the refresh active signal according to the refresh active control signal and the refresh standby signal within the read cycle.

37 Claims, 9 Drawing Sheets

ACTIVE CYCLE CONTROL CIRCUIT AND METHOD FOR SEMICONDUCTOR MEMORY APPARATUS

BACKGROUND

1. Technical Field

The present invention relates to a semiconductor memory apparatus, and in particular, to an active cycle control circuit and method for a semiconductor memory apparatus.

2. Related Art

As shown in FIG. 1, an active cycle control circuit of a semiconductor memory apparatus according to the related art includes a precharge signal output unit 10 that outputs a precharge signal pcg according to a ready signal ready, a ready signal output unit 20 that outputs the ready signal ready and a delayed ready signal ready_d according to an address transition signal atdsum and a ready reset signal ready_reset, a refresh standby signal output unit 30 that outputs a refresh standby signal ref_standby according to a refresh request signal srefreq and a refresh active signal rowact_ref that activates a word line for refresh, and an active control unit 40 that outputs the refresh active signal rowact_ref, the ready reset signal ready_reset, and a row active signal, rowact that activates a word line so as to perform an external command (read or write) according to the precharge signal pcg, the delayed ready signal ready_d, and the refresh standby signal ref_standby.

The operation of the active cycle control circuit according to the related art having the above-described structure will be described with reference to FIGS. 1 and 2.

First, a word line active operation for performing the external command, for example, a 'read' command, will be described.

When an address is changed according to the read command, the address transition signal atdsum is enabled to a logic high level.

Accordingly, the ready signal output unit 20 enables the ready signal ready to a logic high level and then enables the delayed ready signal ready_d to a logic high level after a predetermined delay time lapses.

When the ready signal ready is enabled at the logic high level, the precharge signal output unit 10 enables the precharge signal pcg to the logic high level.

If the refresh standby signal ref_standby is disabled to a logic low level at a time when the precharge signal pcg is enabled at the logic high level, the active control unit 40 enables the row active signal rowact to the logic high level.

A word line corresponding to the changed address is activated according to the row active signal rowact, and then a read operation is performed. The word line is activated until the address is changed again.

If the delayed ready signal ready_d is enabled at the logic high level, the active control unit 40 enables the ready reset signal ready_reset to the high level.

As the ready reset signal ready_reset is enabled at a logic high level, the ready signal output unit 20 resets the ready signal ready in a the logic low level and prepares a next read cycle.

Next, a word line active operation for performing a refresh operation will be described.

The refresh request signal srefreq is generated at every prescribed refresh cycle.

If the refresh request signal srefreq is enabled, the refresh standby signal output unit 30 enables the refresh standby signal ref_standby to the logic high level.

In a state where the refresh standby signal ref_standby is enabled at the logic high level, if the precharge signal pcg is enabled and then a precharge operation is performed, the active control unit 40 needs to enable the refresh active signal rowact_ref to the logic high level such that the corresponding word line is activated and the refresh operation is performed.

However, as shown in FIG. 2, even though the refresh standby signal ref_standby is enabled at high level according to the refresh request signal srefreq, when the read cycle is proceeding, the refresh operation is not performed. Then, when a new address is input after a read cycle time tRC, the refresh active signal rowact_ref is enabled to the logic high level, such that the refresh operation is performed and then the read operation is performed.

As described above, if the read cycle time tRC of the known semiconductor memory apparatus becomes longer than a refresh cycle tREF, the refresh operation is performed during a cycle of the read cycle time tRC.

In order to preserve data values stored in cells of the semiconductor memory apparatus, the refresh operation needs to be repeatedly performed according to the prescribed refresh cycle tREF.

However, when the refresh operation is not performed at every refresh cycle tREF, the data stored in the cells may be lost. Accordingly, in the related art, in order to prevent data loss, a method that limits a maximum value of the read cycle time tRC is used.

As such, in the semiconductor memory apparatus according to the related art, the maximum value of the read cycle time tRC is limited in order to perform the refresh operation cyclically. However, there are many cases where, in a system using the above-described method, a read cycle time larger than the maximum value is required, whereby the above-described method cannot be used.

SUMMARY

Embodiments of the present invention provide an active cycle control circuit and method for, a semiconductor memory apparatus that can perform a refresh operation cyclically with no limit to a read cycle time of the semiconductor memory apparatus.

According to an embodiment of the present invention, an active cycle control circuit for a semiconductor memory apparatus may include a refresh active control signal generation unit that may generate a refresh active control signal during the same cycle as a refresh request signal at a timing earlier than the refresh request signal; a refresh standby signal output unit that may output a refresh standby signal according to a refresh active signal and the refresh request signal; and an active control unit that may output a row active signal for performing a read cycle according to a read command, and output the refresh active signal according to the refresh active control signal and the refresh standby signal within the read cycle.

According to another embodiment of the present invention, an active cycle control circuit for a semiconductor memory apparatus may include; a precharge signal output unit that may output a precharge signal according to a ready signal; a ready signal output unit that may output the ready signal and a delayed ready signal for performing a read cycle according to a combination of an address transition signal, a refresh active control signal, and a refresh standby signal, or for performing a refresh operation at a prescribed cycle regardless of the read cycle; a refresh standby signal output unit that may, output the refresh standby signal according to a refresh active signal and a refresh request signal; a refresh timing control unit that may generate the refresh request signal during a predetermined cycle and may output the refresh active control signal having an enable timing earlier than the refresh request signal by a predetermined time; and an active control unit that may output the refresh active signal according to the precharge signal and the refresh standby signal and may output a row active signal according to the precharge signal and the delayed ready signal.

According to still another embodiment of the present invention, an active cycle control method for a semiconductor memory apparatus may include, when a refresh request signal is enabled during a read cycle, precharging an activated word line according to the read cycle and activating a word line corresponding to the refresh request signal so as to perform a refresh operation, and, after the refresh operation is performed, precharging the word line corresponding to the refresh operation and activating the word line according to the read cycle.

According to yet another embodiment of the present invention, an active cycle control method for a semiconductor memory apparatus may include generating a refresh request signal during a predetermined cycle, generating a refresh active control signal using a timing at which the refresh request signal is generated, when the refresh request signal is enabled during a read cycle, precharging a currently activated word line using the refresh active control signal and activating a word line corresponding to the refresh request signal so as to perform a refresh operation, and after the refresh operation is performed, precharging the word line corresponding to the refresh operation and activating the word line according to the read cycle.

DESCRIPTION OF EXEMPLARY EMBODIMENTS

Hereinafter, an exemplary embodiment of an active cycle control circuit and method for a semiconductor memory apparatus will be described in detail with reference to the accompanying drawings.

Figure 1:
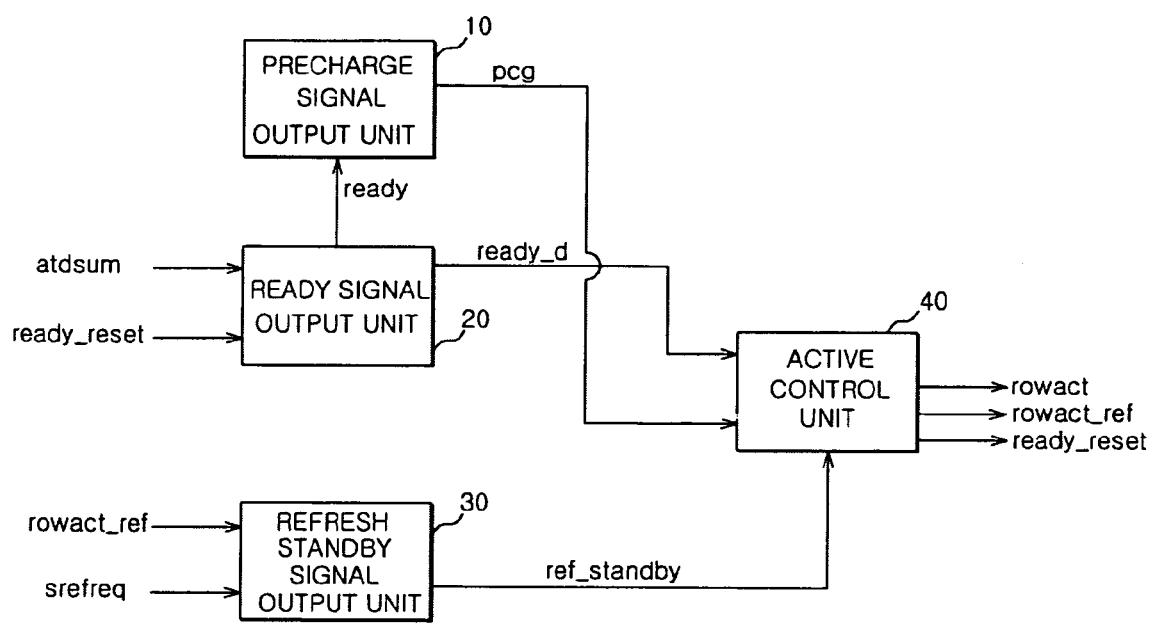
FIG. 1 is a block diagram of an active cycle control circuit for a semiconductor memory apparatus according to the related art.
Figure 2:
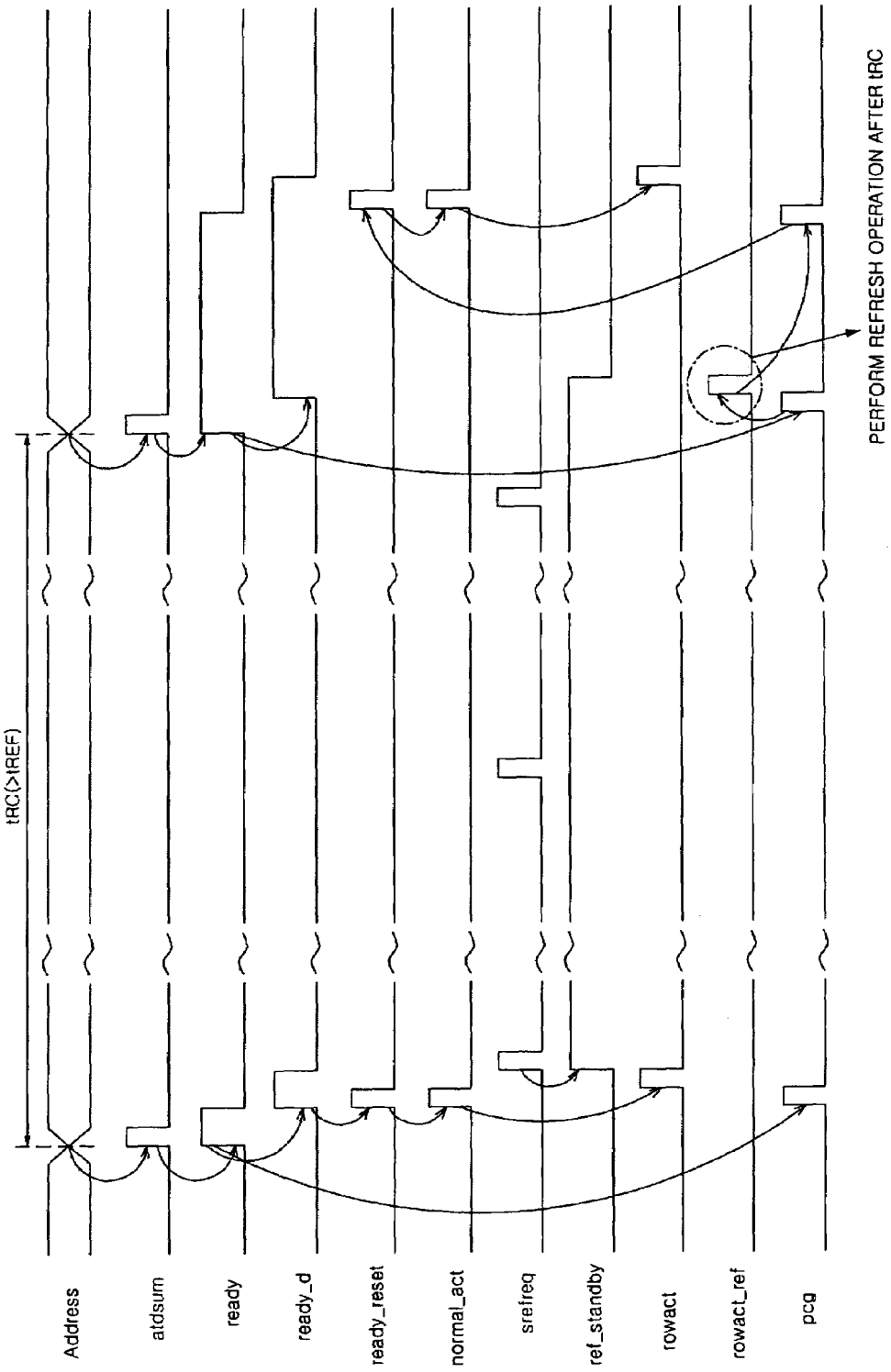
FIG. 2 is a diagram showing output waveforms of individual units of the active cycle control circuit for a semiconductor memory apparatus according to the related art.
Figure 3:
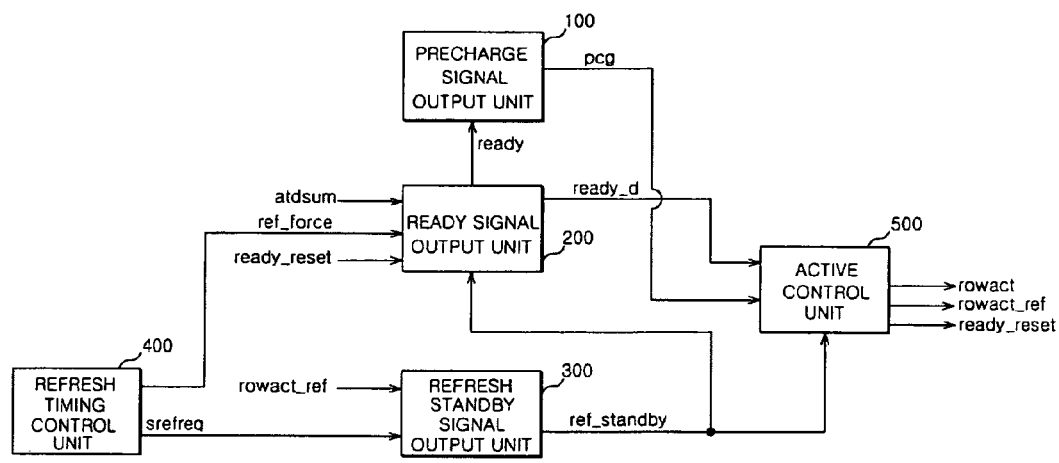
FIG. 3 is a block diagram of an active cycle control circuit for a semiconductor memory apparatus according to an exemplary embodiment of the present invention.

As shown FIG. 3, the active cycle control circuit for a semiconductor memory apparatus may include; a precharge signal output unit 100 that outputs a precharge signal pcg according to a ready signal ready; a ready signal output unit 200 that outputs the ready signal ready and a delayed ready signal ready_d for performing a read cycle according to a combination of an address transition signal atdsum, a refresh active control signal ref_force, and a refresh standby signal ref_standby, or for performing a refresh operation at a prescribed cycle regardless of the read cycle; a refresh standby signal output unit 300 that outputs the refresh standby signal ref_standby according to a refresh active signal rowact_ref and a refresh request signal srefreq; a refresh timing control unit 400 that generates the refresh request signal srefreq during a predetermined cycle and outputs the refresh active control signal ref_force having an enable timing earlier than the refresh request signal srefreq by a predetermined time; and an active control unit 500 that outputs the refresh active signal rowact_ref according to the precharge signal pcg and the refresh standby signal ref_standby, and outputs a row active signal rowact according to the precharge signal pcg and the delayed ready signal ready_d.

Figure 4:
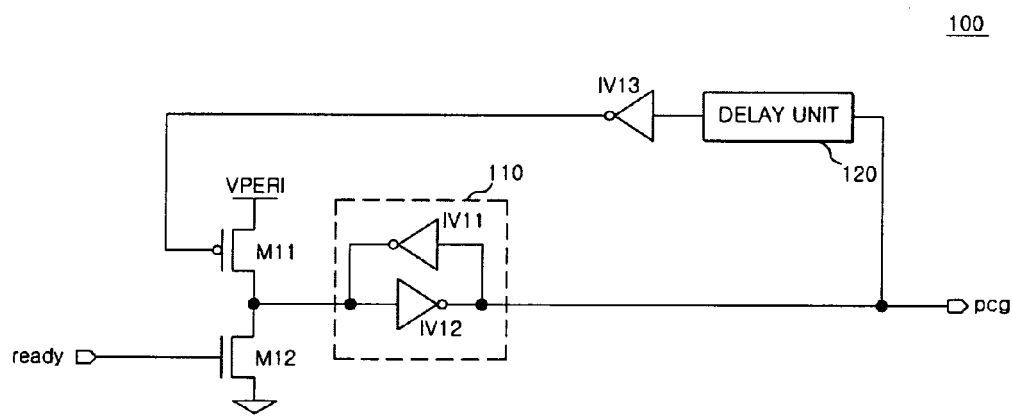
FIG. 4 is a circuit diagram of the exemplary precharge signal output unit of FIG. 3.

When the ready signal ready is enabled, the precharge signal output unit 100 enables the precharge signal pcg in a pulsed manner. An exemplary internal structure of the precharge signal output unit 100 is shown in FIG. 4. The precharge signal output unit 100 may include a first transistor M11 that has a source coupled to a power terminal VPERI; a second transistor M12 that has a drain coupled to the drain of the first transistor M11, a source coupled to a ground, and a gate which receives the ready signal ready, a latch 110 including a first inverter IV11 and a second inverter IV12 that latches the voltage level of a connection node between the first transistor M11 and the second transistor M12 to output the precharge signal pcg; a delay unit 120 that delays the output of the latch 110 by a predetermined time; and a third inverter IV13 that receives and inverts the output of the delay unit 120, and provides the inverted output of the delay unit 120 to the gate of the first transistor M11.

An example of the operation of the exemplary precharge signal output unit 100 will be described below.

If the ready signal ready is enabled to a logic high level, the latch 110 latches a high level value and outputs the precharge signal pcg at the logic high level. Then, the output of the latch 110 is delayed by a predetermined time through the delay unit 120 and the third inverter IV13 outputs a logic low level signal, such that the output of the latch 110 is changed to the logic low level. Accordingly, the pulse width of the precharge signal pcg is determined by the delay time of the delay unit 120.

When the address transition signal atdsum is enabled, and the refresh active control signal ref_force and the refresh standby signal ref_standby are enabled, the ready signal output unit 200 enables the ready signal ready and the delayed ready signal ready_d. When the ready reset signal ready_reset is enabled, the ready signal output unit 200 disables the ready signal ready and the delayed ready signal ready_d.

Figure 5:
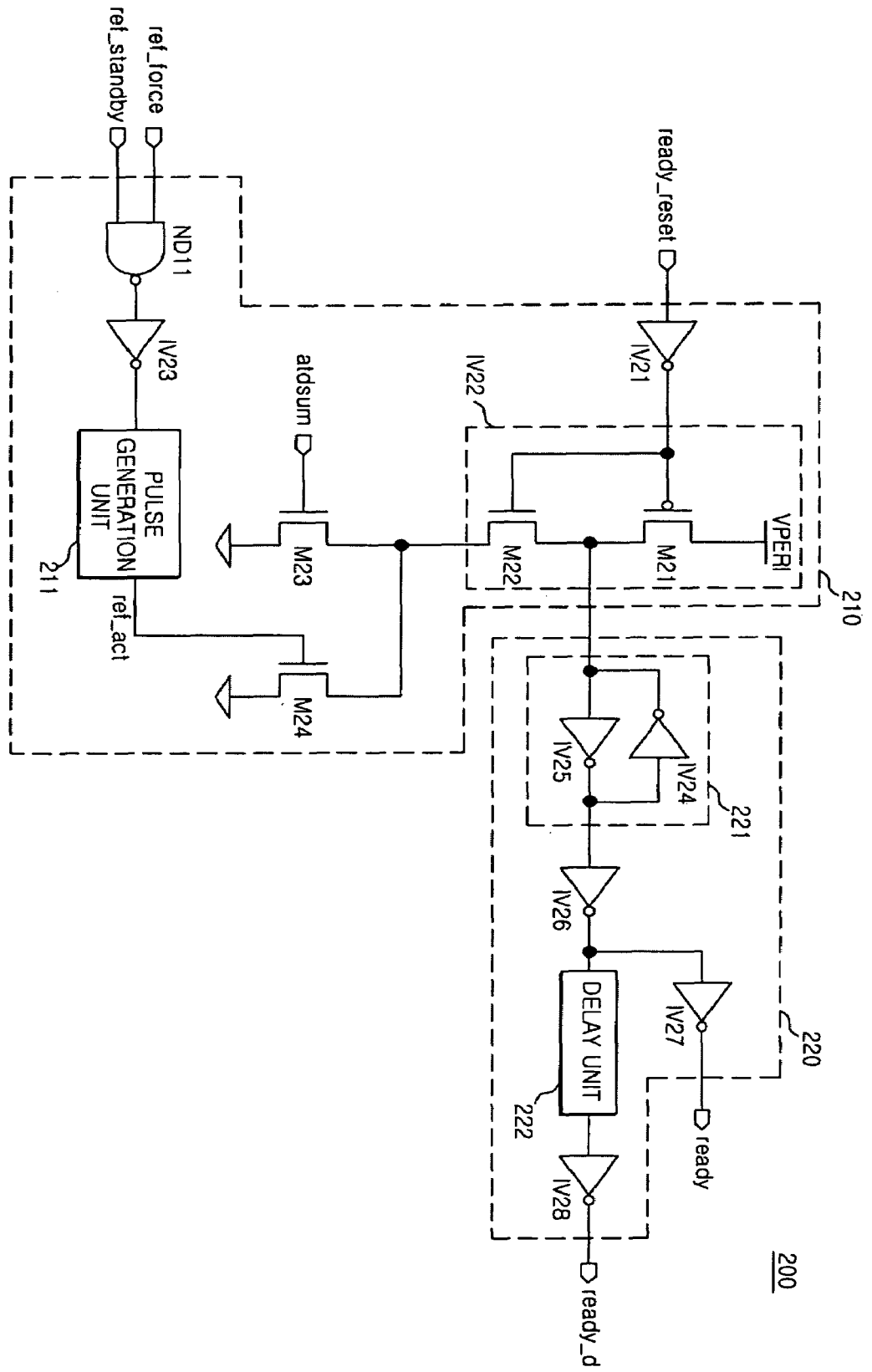
FIG. 5 is a circuit diagram of the exemplary ready signal output unit of FIG. 3.

An example of the internal structure of the ready signal output unit 200 is shown in FIG. 5. The ready signal output unit 200 may include a judging unit 210 that judges whether or not the ready signal ready and the delayed ready signal ready_d are enabled according to the ready reset signal ready_reset, the refresh active control signal ref_force, and the refresh standby signal ref_standby, and an output unit 220 that outputs the ready signal ready and the delayed ready signal ready_d based on the output of the judging unit 210.

The judging unit 210 includes a first inverter IV21 that receives the ready reset signal ready_reset; a second inverter IV22 including first and second transistors M21 and M22 that receives an output of the first inverter IV21 through an input terminal thereof; a third transistor M23 that has a drain coupled to the source of the second transistor M22, a source coupled to a ground, and a gate which receives the address transition signal atdsum; a NAND gate ND11 that receives the refresh active control signal ref_force and the refresh standby signal ref_standby; a third inverter IV23 that receives the output of the NAND gate ND11; a pulse generation unit 211 that receives the output of the third inverter IV23 and outputs a refresh active ready signal ref_act; and a fourth transistor M24 that has a drain coupled to the drain of the third transistor M23, a source coupled to a ground, and a gate which receives the refresh active ready signal ref_act. The pulse generation unit 211 is configured to generate a logic high pulse when a logic high-level signal is input.

The output unit 220 may include a latch 221 that has a fourth inverter IV24 and a fifth inverter IV25 and receives the output of the second inverter IV22; a sixth inverter IV26 that receives the output of the latch 221; a seventh inverter IV27 that inverts the output of the sixth inverter IV26 and outputs the ready signal ready; a delay unit 222 that receives the output of the sixth inverter IV26; and an eighth inverter that inverts the output of the delay unit 222 and outputs the delayed ready signal ready_d.

An example of the operation of the exemplary ready signal output unit 200 will be described below.

When the refresh active control signal ref_force and the refresh standby signal ref_standby are enabled at a logic high level, the pulse generation unit 211 may output the refresh active ready signal ref_act in a pulsed manner. Accordingly, the fourth transistor M24 is turned on. At this time, if the ready reset signal ready_reset is at a logic low level, the final output of the judging unit 210 becomes a logic low level. Therefore, the latch 221 of the output unit 220 outputs a logic high level signal, such that the ready signal ready is enabled at a high level and then the delayed ready signal ready_d is enabled at a high level after being delayed by the delay unit 222.

When the refresh request signal srefreq is enabled, the refresh standby signal output unit 300 may enable the refresh standby signal ref_standby. When the refresh active signal rowact_ref is enabled to a logic high level, the refresh standby signal output unit 300 may disable the refresh standby signal ref_standby to a logic low level.

Figure 6:
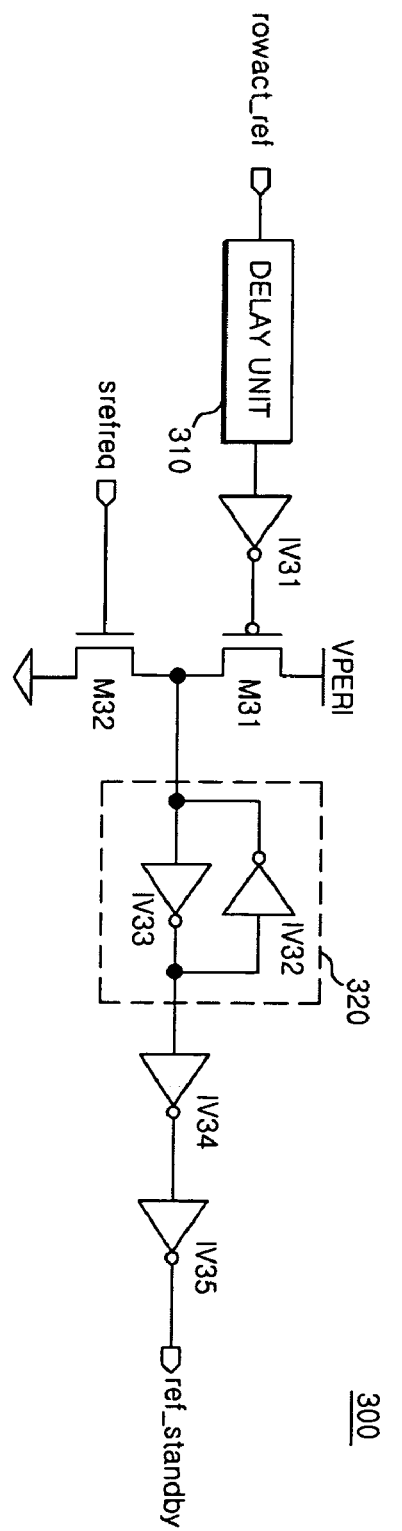
FIG. 6 is a circuit diagram of the exemplary refresh standby signal output unit of FIG. 3.

As shown in FIG. 6, the refresh standby signal output unit 300 may include a delay unit 310 that receives the refresh active signal rowact_ref; a first inverter IV31 that receives the output of the delay unit 310; a first transistor M31 that has a source coupled to the power terminal VPERI and a gate which receives the output of the first inverter IV31, a second transistor M32 that has a drain coupled to a drain of the first transistor M31, a source coupled to a ground, and a gate which receives the refresh request signal srefreq, a latch 320 that has a second inverter IV32 and a third inverter IV33 and receives a voltage level of a connection node between the first transistor M31 and the second transistor M32; and fourth and fifth inverters IV34 and IV35 that receive and buffer the output of the latch 320 and output the refresh standby signal ref_standby.

An example operation of the exemplary refresh standby signal output unit 300 will be described below.

If the refresh request signal srefreq is enabled at a logic high level, the high-level refresh request signal srefreq may be latched by the latch 320; and thus the refresh standby signal ref_standby may be enabled at a logic high level.

Meanwhile, if the refresh active signal rowact_ref is enabled, a logic low level signal may be output through the latch 320 after being delayed by the delay unit 310, such that the refresh standby signal ref_standby may be disabled to a logic low level.

The refresh timing control unit 400 may generate the refresh request signal srefreq during every prescribed refresh cycle and may generate the refresh active control signal ref_force during the same cycle as the refresh cycle at a timing earlier than the refresh request signal srefreq.

Figure 7:
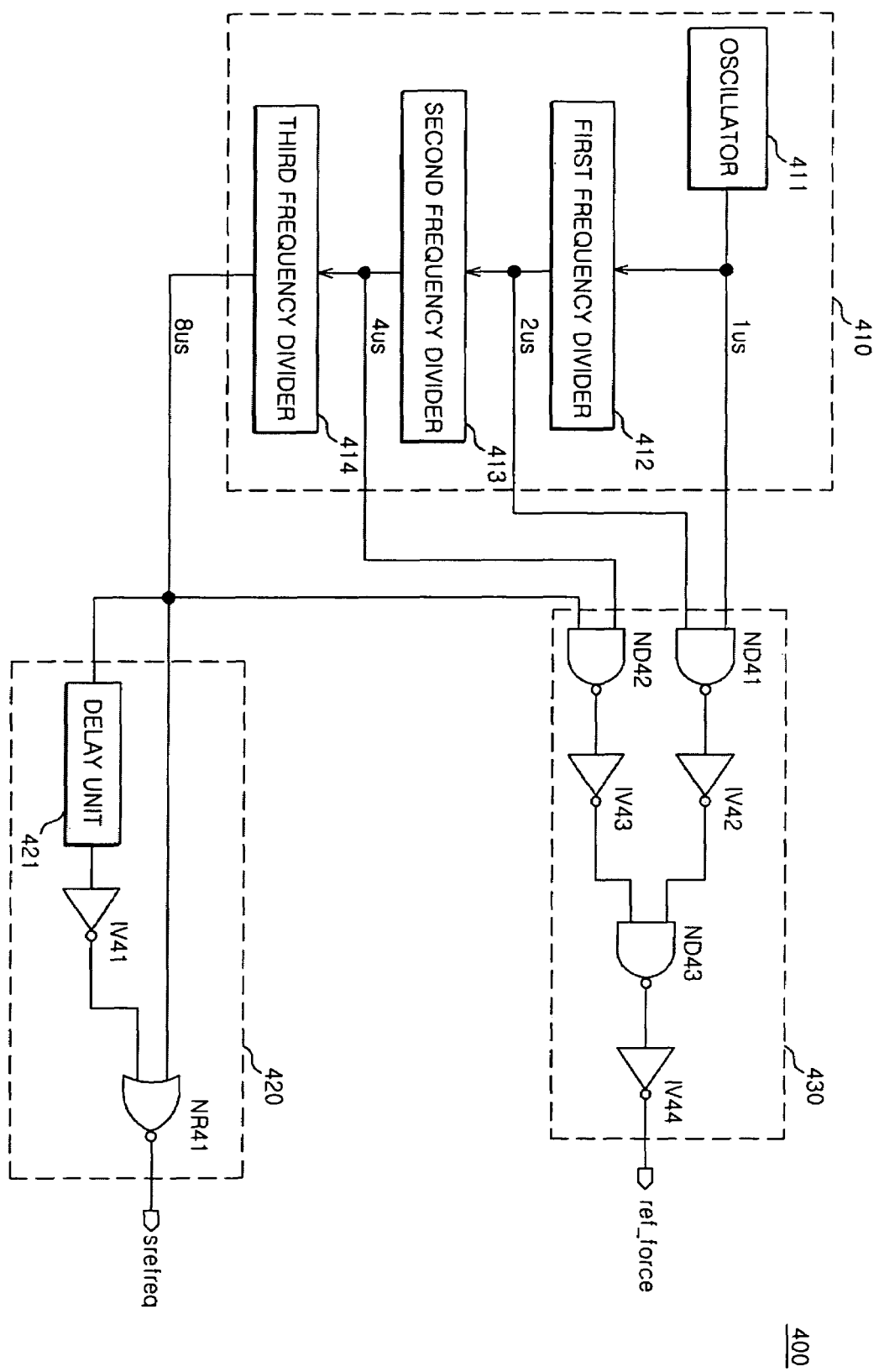
FIG. 7 is a circuit diagram of the exemplary refresh timing control unit of FIG. 3.

An example of the internal structure of the refresh timing control unit 400 is shown in FIG. 7. The refresh timing control unit 400 may include a timing signal generation unit 410 that generates one or more timing signals having different cycles for generating the refresh cycle; a refresh request signal generation unit 420 that generates the refresh request signal srefreq using the timing signal at every prescribed refresh cycle (for example, 8 μs); and a refresh active control signal generation unit 430 that generates the refresh active control signal ref_force during the same cycle as the refresh cycle at a timing earlier than the refresh request signal srefreq using the timing signal.

The timing signal generation unit 410 may include an oscillator 411 that generates a basic timing signal (for example, 1 μs), a first frequency divider 412 that divides the output of the oscillator 411 so as to output a first timing signal at a cycle of, for example, 2 μs, a second frequency divider 413 that divides the output of the first frequency divider 412 so as to output a second timing signal at a cycle of, for example, 4 μs, and a third frequency divider 414 that divides the output of the second frequency divider 413 so as to output a third timing signal at a cycle of, for example, 8 μs.

The refresh request signal generation unit 420 may include a delay unit 421 that receives the output of the third frequency divider 414, a first inverter IV41 that receives the output of the delay unit 421, and a NOR gate NR41 that receives the output of the third frequency divider 421 and the output of the first inverter IV41 and outputs the refresh request signal srefreq.

The refresh active control signal generation unit 430 may include a first NAND gate ND41 that receives the output of the oscillator 411 and the output of the first frequency divider 412, a second NAND gate ND42 that receives the output of the second frequency divider 413 and the output of the third frequency divider 414, a second inverter IV42 that receives the output of the first NAND gate ND41, a third inverter IV43 that receives the output of the second NAND gate ND42, a third NAND gate ND43 that receives the outputs of the second inverter IV42 and the third inverter IV43, and a fourth inverter IV44 that receives the output of the third NAND gate ND43 and outputs the refresh active control signal ref_force.

Figure 8:
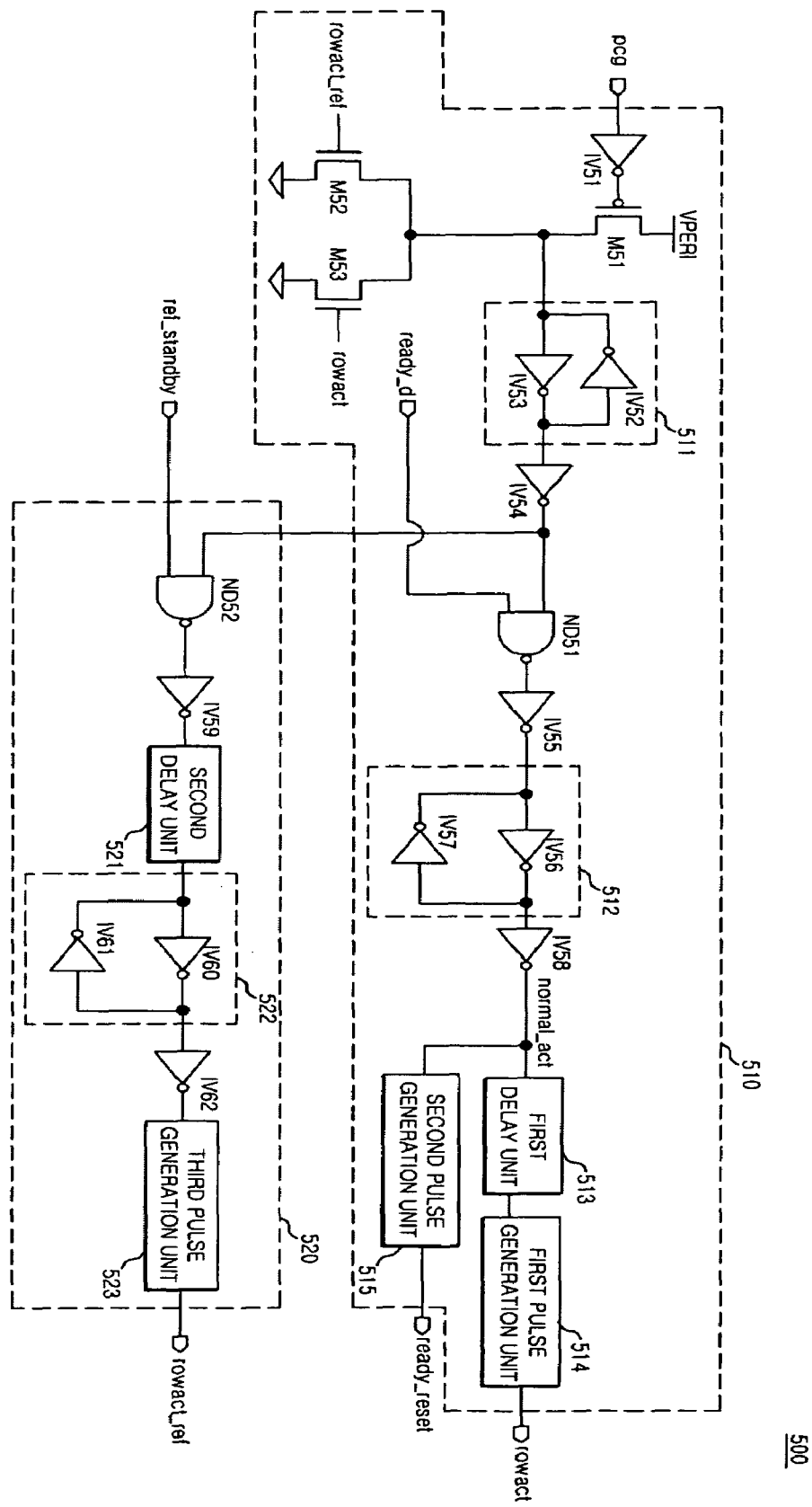
FIG. 8 is a circuit diagram of the exemplary active control unit of FIG. 3.

If the precharge signal pcg and the delayed ready signal ready_d are enabled, the active control, unit 500 may enable the row active signal rowact and the ready reset signal ready_reset. If the precharge signal pcg and the refresh standby signal ref_standby are enabled, the refresh active signal rowact_ref may be enabled. An example of the internal structure of the active control unit 500 is shown in FIG. 8. The active control unit 500 may include a first active signal generation unit 510 that may generate the row active signal rowact and the ready reset signal ready_reset according to the precharge signal pcg and the delayed ready signal ready_d; and a second active signal generation unit 520 that may generate the refresh active signal rowact_ref according to the precharge signal pcg and the refresh standby signal ref_standby.

The first active signal generation unit 510 may include a first inverter IV51 that receives the precharge signal pcg; a first transistor M51 that has a source coupled to the power terminal VPERI and a gate which receives the output of the first inverter IV51, second and third transistors M52 and M53 that have drains commonly coupled to the drain of the first transistor M51, sources coupled to a ground, and gates which receive the refresh active signal rowact_ref and the row active signal rowact respectively; a first latch 511 including a second inverter IV52 and a third inverter IV53 that receives the voltage level of the drain of the first transistor M51; a fourth inverter IV54 that receives the output of the first latch 511; a first NAND gate ND51 that receives the output of the fourth inverter IV54 and the delayed ready signal ready_d; a fifth inverter IV55 that receives the output of the first NAND gate ND51; a second latch 512 including a sixth inverter IV56 and a seventh inverter IV57 that receives the output of the fifth inverter IV55; an eighth inverter IV58 that receives the output of the second latch 512 and outputs a normal active signal normal_act; a first delay unit 513 that receives the normal active signal normal_act; a first pulse generation unit 514 that receives the output of the first delay unit 513 and outputs the row active signal rowact; and a second pulse generation unit 515 that receives the normal active signal normal_act and outputs the ready reset signal ready_reset.

The second active signal generation unit 520 may include; a second NAND gate ND52 that receives the output of the fourth inverter IV54 and the refresh standby signal ref_standby; a ninth inverter IV59 that receives the output of the second NAND gate ND52; a second delay unit 521 that receives the output of the ninth inverter IV59; a third latch 522 that including a tenth inverter IV60 and an eleventh inverter IV61 that receives the output of the second delay unit 521; a twelfth inverter IV62 that receives the output of the third latch 522; and a third pulse generation unit 523 that receives the output of the twelfth inverter IV62 and outputs the refresh active signal rowact_ref. The first to third pulse generation units 514, 515, and 523 may generate a high level pulse when a high level signal is input.

An example of the operation of the exemplary active control unit 500 will be described below.

If the precharge signal pcg is enabled, the first latch 511 of the first active signal generation unit 510 outputs a logic low level signal. In a period where the delayed ready signal ready_d is at a logic high level, since the second latch 512 outputs a logic low level signal and the logic high-level normal active signal normal_act is output through the eighth inverter IV58, the ready reset signal ready_reset is enabled to the logic high level through the second pulse generation unit 515 and the row active signal rowact is enabled to the logic high level through the first pulse generation unit 514 after the delay time of the first delay unit 513. Further, when the output of the fourth inverter IV54 of the first active signal generation unit 510 is at the logic high level and the refresh standby signal ref_standby is at the logic high level, a logic high level signal is output through the third latch 522 and the twelfth inverter IV62 after being delayed by the second delay unit 521 of the second active signal generation unit 520, and the refresh active signal rowact_ref is enabled to a logic high level through the third pulse generation unit 523. Meanwhile, as the row active signal rowact or the refresh active signal rowact_ref is enabled to the logic high level, since the second transistor M2 or the third transistor M53 of the first active signal generation unit 510 is turned on, the output of the first latch 511 is changed to a logic high level signal, such that the normal active signal normal_act is disabled to a logic low level.

An exemplary active control operation of the semiconductor memory apparatus having the above-described structure will be described with reference to FIGS. 3 to 10.

A word line active operation for performing an external command, for example, a read command, may be the same as the related art, and thus the description thereof will be omitted. Hereinafter, an example of a word line active operation according to the refresh request signal srefreq generated within a read cycle time will be described below.

The refresh timing control unit 400 of FIG. 7 may generate the refresh request signal srefreq, during every prescribed refresh cycle and may generate the refresh active control signal ref_force during the same cycle as the refresh cycle at a timing earlier than the refresh request signal srefreq.

Figure 9:
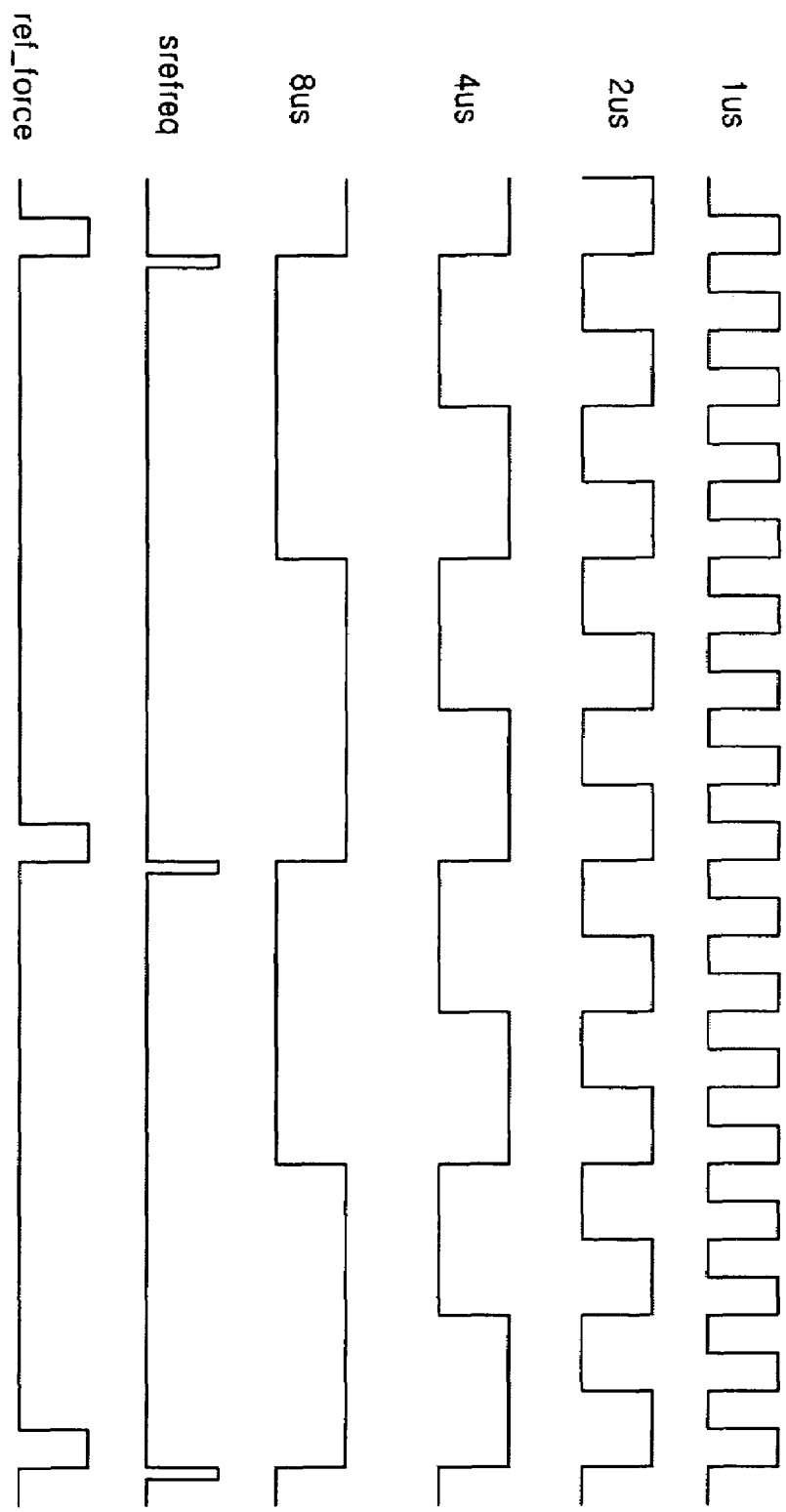
FIG. 9 is a diagram showing exemplary output waveforms of individual units of the refresh timing control unit of FIG. 3.
Figure 10:
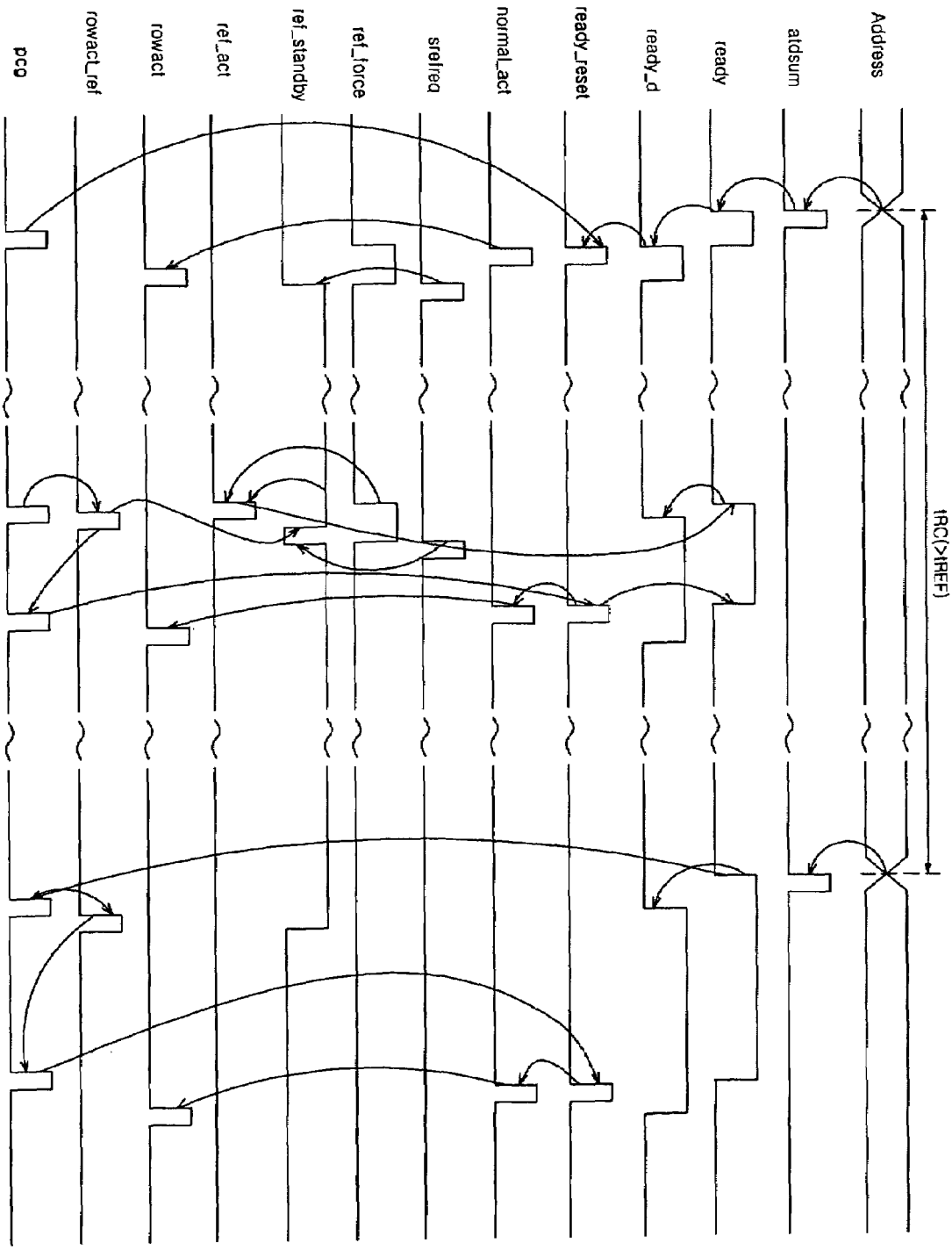
FIG. 10 is a diagram showing exemplary output waveforms of individual units of the active cycle control circuit for a semiconductor memory apparatus according to the embodiment of the present invention.

That is, as shown in FIG. 9, at a timing at which all the output signals of the first to third frequency dividers 412 to 414 of the refresh timing control unit 400 become the logic high level, the refresh active control signal ref_force may be generated. Further, at a timing at which all the output signals of the first to third frequency dividers 412 to 414 become the logic low level, the refresh request signal srefreq may be generated.

The refresh standby signal output unit 300 of FIG. 6 may enable the refresh standby signal ref_standby at logic high level according to the refresh request signal srefreq and may keep the enabled state of the refresh standby signal ref_standby until the refresh active signal rowact_ref is enabled.

If the refresh active control signal ref_force and the refresh standby signal ref_standby are enabled at high level, the ready signal output unit 200 shown in FIG. 5 may enable the refresh active ready signal ref_act to a logic high level. Accordingly, the ready signal ready is enabled to a logic high level and the delayed ready signal ready_d is enabled to a logic high level after a predetermined delay time. At this time, the ready reset signal ready_reset may be disabled to the logic low level.

If the ready signal ready is enabled at high level, the precharge signal output unit 100 of FIG. 4 may enable the precharge signal pcg to a logic high level so as to precharge a word line according to the read cycle.

In a state where the refresh standby signal ref_standby is enabled at high level, as the precharge signal pcg is enabled at high level, the active control unit 500 may enable the refresh active signal rowact_ref to a logic high level so as to activate a word line for performing the refresh operation.

As the refresh active signal rowact_ref is enabled at high level, the refresh standby signal output unit 300 of FIG. 6 may disable the refresh standby signal ref_standby to the logic low level. If the refresh request signal srefreq is enabled at high level, the refresh standby signal output unit 300 may enable the refresh standby signal ref_standby to a logic high level again.

After the refresh active signal rowact_ref is enabled, the precharge signal output unit 100 of FIG. 4 may enable the precharge signal pcg at a logic high level using the ready signal ready so as to precharge the word line activated for the refresh operation.

Thereafter, the active control unit 500 of FIG. 8 may enable the normal active signal normal_act and the ready reset signal ready_reset at a logic high level and may enable the row active signal rowact at a logic high level after a predetermined delay time so as to activate a word line corresponding to the original read cycle.

It will be apparent to those skilled in the art that various modifications and changes may be made without departing from the scope and spirit of the present invention. Therefore, it should be understood that the above embodiments are not limiting, but illustrative in all embodiments. The scope of the present invention is defined by the appended claims rather than by the description preceding them, and therefore all changes and modifications that fall within the metes and bounds of the claims, or equivalents of such metes and bounds are therefore intended to be embraced by the claims.

The active cycle control circuit for a semiconductor memory apparatus may perform the refresh operation cyclically within the read cycle and thus may have the following effects.

First, since it is unnecessary to limit the read cycle time, the compatibility of the semiconductor memory apparatus can be improved.

Second, since a stable refresh operation can be performed, the reliability of the semiconductor memory apparatus can be improved.

What is claimed is:

1. An active cycle control circuit for a semiconductor memory apparatus comprising:
   a precharge signal output unit that is configured to output a precharge signal according to a ready signal;
   a ready signal output unit that is configured to output the ready signal and a delayed ready signal based on a combination of an address transition signal, a refresh active control signal, and a refresh standby signal;
   a refresh standby signal output unit that is configured to output the refresh standby signal according to a refresh active signal and a refresh request signal;
   a refresh timing control unit that is configured to generate the refresh request signal at a predetermined cycle, and output the refresh active control signal having an enable timing earlier than the refresh request signal; and
   an active control unit that is configured to output the refresh active signal according to the precharge signal and the refresh standby signal, and output a row active signal according to the precharge signal and the delayed ready signal.

2. The active cycle control circuit of claim 1, wherein, when the ready signal is enabled, the precharge signal output unit enables the precharge signal in a pulsed manner.

3. The active cycle control circuit of claim 1, wherein the precharge signal output unit includes:
   a first transistor that has a drain, a gate, a source coupled to a power terminal,
   a second transistor that has a drain coupled to the drain of the first transistor at a connection node, a source coupled to a ground, and a gate, to which the ready signal is input,
   a latch that is configured to latch a voltage level at the connection node between the first transistor and the second transistor and output the precharge signal,
   a delay unit configured to delay the precharge signal output of the latch by a predetermined time to provide an output, and
   an inverter that is configured to receive and inverts the output of the delay unit to produce an inverted output, wherein the gate of the first transistor is configured to receive inverted output of the delay unit.

4. The active cycle control circuit of claim 1, wherein, when an address is changed, and the refresh active control signal and the refresh standby signal are enabled, the ready signal output unit enables the ready signal and the delayed ready signal.

5. The active cycle control circuit of claim 1, wherein the ready signal output unit includes:
   a judging unit that is configured to judge whether or not the ready signal and the delayed ready signal are enabled according to the address transition signal, the refresh active control signal, and the refresh standby signal and to produce an output based thereon, and
   an output unit that is configured to output the ready signal and the delayed ready signal according to the output of the judging unit.

6. The active cycle control circuit of claim 5, wherein the judging unit includes:
   a first inverter that is configured to receive a ready reset signal and has an output,
   a second inverter that includes first and second transistors, the second transistor having a source, and that has an input terminal is coupled to the output of the first inverter
   a third transistor that has a drain coupled to the source of the second transistor, a source coupled to a ground, and a gate, to which the address transition signal is input,
   a NAND gate that is configured to receive the refresh active control signal and the refresh standby signal, and to produce an output based thereon
   a third inverter that is configured to receive the output of the NAND gate to produce an output,
   a pulse generation unit that is configured to receive the output of the third inverter and output a refresh active ready signal, and
   a fourth transistor that has a drain coupled to the drain of the third transistor, a source coupled to ground, and a gate, to which the refresh active ready signal is input.

7. The active cycle control circuit of claim 6, wherein the pulse generation unit generates a logic high pulse as the output of the third inverter is changed.

8. The active cycle control circuit of claim 5, wherein the output unit includes:
   a latch that has first and second inverters and is configured to receive the output of the judging unit to produce an output,
   a third inverter that is configured to receive the output of the latch to produce an output,
   a fourth inverter that is configured to invert the output of the third inverter and output the ready signal,
   a delay unit that is configured to receive the output of the third inverter to produce an output, and
   a fifth inverter that is configured to invert the output of the delay unit and output the delayed ready signal.

9. The active cycle control circuit of claim 1, wherein the refresh standby signal output unit is configured to enable the refresh standby signal when the refresh request signal is enabled, and disable the refresh standby signal when the refresh active signal is enabled.

10. The active cycle control circuit of claim 1, wherein the refresh standby signal output unit includes:
    a delay unit that is configured to receive the refresh active signal and to produce an output,
    a first inverter that is configured to receive the output of the delay unit and to produce an output,
    a first transistor that has a drain, a source coupled to a power terminal and a gate, to which the output of the first inverter is input,
    a second transistor that has a drain coupled to the drain of the first transistor at a connection node, a source coupled to ground, and a gate, to which the refresh request signal is input,
    a latch that has a second inverter and a third inverter and receives a voltage level at the connection node between the first transistor and the second transistor and to produce an output, and
    a buffer that is configured to receive and buffer the output of the latch and output the refresh standby signal.

11. The active cycle control circuit of claim 1,
wherein the refresh timing control unit is configured to generate the refresh request signal at every prescribed refresh cycle and generate the refresh active control signal at the same cycle as the refresh cycle at a timing earlier than the refresh request signal.

12. The active cycle control circuit of claim 1,
wherein the refresh timing control unit includes:
a timing signal generation unit that is configured to generate one or more timing signals having different cycles for generating the refresh cycle,
a refresh request signal generation unit that is configured to generate the refresh request signal at every prescribed refresh cycle using the timing signals, and
a refresh active control signal generation unit that is configured to generate the refresh active control signal at a same cycle as the refresh cycle at a timing earlier than the refresh request signal based on the timing signals.

13. The active cycle control circuit of claim 12,
wherein the timing signal generation unit includes;
an oscillator that is configured to generate a basic timing signal,
a first frequency divider that is configured to divide the basic timing signal of the oscillator and output a first timing signal,
a second frequency divider that is configured to divide the first timing signal of the first frequency divider and output a second timing signal, and
a third frequency divider that is configured to divide the second timing signal of the second frequency divider and output a third timing signal.

14. The active cycle control circuit of claim 13,
wherein the first frequency divider, the second frequency divider, and the third frequency divider divide respective input timing signals by two.

15. The active cycle control circuit of claim 12,
wherein the refresh request signal generation unit includes:
a delay unit that is configured to receive the timing signal and to produce an output,
a first inverter that is configured to receive the output of the delay unit and to produce an output, and
a NOR gate that is configured to receive the timing signal and the output of the first inverter and output the refresh request signal.

16. The active cycle control circuit of claim 12,
wherein the refresh active control signal generation unit includes:
first and second NAND gates that are configured to respectively receive two timing signals, having different cycles and to produce respective outputs
a second inverter that is configured to receive the output of the first NAND gate and to produce an output,
a third inverter that is configured to receive the output of the second NAND gate and to produce an output,
a third NAND gate that is configured to receive the outputs of the second inverter and the third inverter and to produce an output, and
a fourth inverter that is configured to receive the output of the third NAND gate and output the refresh active control signal.

17. The active cycle control circuit of claim 1,
wherein the active control unit is configured to enable the row active signal when the precharge signal and the delayed ready signal are enabled, and enable the refresh active signal when the precharge signal and the refresh standby signal are enabled.

18. The active cycle control circuit of claim 1,
wherein the active control unit includes:
a first active signal generation unit that is configured to generate the row active signal and a ready reset signal based on the precharge signal and the delayed ready signal, and
a second active signal generation unit that is configured to generate the refresh active signal based on the precharge signal and the refresh standby signal.

19. The active cycle control circuit of claim 18,
wherein the first active signal generation unit includes:
a first inverter that is configured to receive the precharge signal and to produce an output,
a first transistor that has a drain, a source coupled to a power terminal and a gate, to which the output of the first inverter is input,
second and third transistors that have drains commonly coupled to the drain of the first transistor, sources coupled to a ground, and gates, to which the refresh active signal and the row active signal are input, respectively;
a first latch that has second and third inverters and is configured to receive a voltage level at the drain of the first transistor and to produce an output,
a fourth inverter that is configured to receive the output of the first latch,
a first NAND gate that is configured to receive the output of the fourth inverter and the delayed ready signal and to produce an output,
a fifth inverter that is configured to receive the output of the first NAND gate and to produce an output,
a second latch that has sixth and seventh inverters and is configured to receive the output of the fifth inverter and to produce an output,
an eighth inverter that is configured to receive the output of the second latch and output a normal active signal,
a first delay unit that is configured to receive the normal active signal and to produce an output,
a first pulse generation unit that is configured to receive the output of the first delay unit and output the row active signal, and
a second pulse generation unit that is configured to receive the normal active signal and output the ready reset signal.

20. The active cycle control circuit of claim 18,
wherein the second active signal generation unit includes:
a NAND gate that is configured to receive the latched value of the precharge signal and the refresh standby signal and to produce an output,
a first inverter that is configured to receive the output of the NAND gate and to produce an output,
a delay unit that is configured to receive the output of the first inverter and to produce an output,
a latch that has second and third inverters is configured to receive the output of the delay unit,
a fourth inverter that is configured to receive the output of the latch and to produce an output, and
a pulse generation unit that is configured to receive the output of the fourth inverter and output the refresh active signal.

21. An active cycle control circuit for a semiconductor memory apparatus, the active cycle control circuit comprising: an refresh active control signal generation unit that is configured to generate a refresh active control signal at a same cycle as a refresh request signal at a timing earlier than the refresh request signal;

a refresh standby signal output unit that is configured to output a refresh standby signal according to a refresh active signal and the refresh request signal; and an active control unit that is configured to output a row active signal for performing a read cycle according to a read command and output the refresh active signal according to the refresh active control signal and the refresh standby signal within the read cycle.

22. The active cycle control circuit of claim 21,
wherein the refresh active control signal generation unit includes:
first and second NAND gates that are configured to receive two timing signals having different cycles, respectively and to produce respective outputs,
a second inverter that is, configured to receive the output of the first NAND gate and to produce an output,
a third inverter that is configured to receive the output of the second NAND gate and to produce an output,
a third NAND gate that is configured to receive the outputs of the second inverter and the third, inverter and to produce an output, and
a fourth inverter that is configured to receive the output of the third NAND gate and output the refresh active control signal.

23. The active cycle control circuit of claim 21,
wherein the refresh standby signal output unit includes:
a delay unit that, is configured to receive the refresh active signal and to produce an output,
a first inverter that is configured to receive the output of the delay unit and to produce an output,
a first transistor that has a drain, a source coupled to a power terminal and a gate, to which the output of the first inverter is input,
a second transistor that has a drain coupled to the drain of the first transistor at a connection node, a source coupled to a ground, and a gate, to which the refresh request signal is input,
a latch that has second inverter and third inverters and is configured to receive a voltage level of the connection node between the first transistor and the second transistor and to produce an output, and
a buffer that is configured to receive and buffer the output of the latch and output the refresh standby signal.

24. The active cycle control circuit of claim 21,
wherein the active control unit includes:
a ready signal output unit that is configured to output a ready signal and a delayed ready signal based on a combination of an address transition signal, the refresh active control signal, and the refresh standby signal, and
an active control unit that is configured to output the row active signal according to a precharge signal and the delayed ready signal, and output the refresh active signal according to the precharge signal and the refresh standby signal.

25. The active cycle control circuit of claim 24,
wherein the ready signal output unit includes:
a judging unit that is configured to determine whether or not the ready signal and the delayed ready signal are enabled according to the address change signal, the refresh active control signal, and the refresh standby signal, and
an output unit that is configured to output the ready signal and the delayed ready signal according to the output of the judging unit.

26. The active cycle control circuit of claim 25,
wherein the judging unit includes:
a first inverter that is configured to receive a ready reset signal and to produce an output,
a second inverter that has first and second transistors, the second transistor having a source, and that is configured to receive the output of the first inverter through an input terminal thereof and to produce an output,
a third transistor that has a drain coupled to the source of the second transistor, a source coupled to ground, and a gate, to which the address transition signal is input,
a NAND gate that is configured to receive the refresh active control signal and the refresh standby signal and to produce an output,
a third inverter that is configured to receive the output of the NAND gate and to produce an output,
a pulse generation unit that is configured to receive the output of the third inverter and output a refresh active ready signal, and
a fourth transistor that has a drain coupled to the drain of the third transistor, a source coupled to ground, and a gate, to which the refresh active ready signal is input.

27. The active cycle control circuit of claim 25,
wherein the output unit includes:
a latch that has first and second inverters and is configured to receive the output of the judging unit,
a third inverter that is configured to receive the output of the latch and to produce an output,
a fourth inverter that is configured to invert the output of the third inverter and output the ready signal,
a delay unit that is configured to receive the output of the third inverter and to produce an output, and
a fifth inverter that is configured to invert the output of the delay unit and output the delayed ready signal.

28. The active cycle control circuit of claim 24,
wherein the active control unit includes:
a first active signal generation unit that is configured to generate the row active signal and a ready reset signal according to the precharge signal and the delayed ready signal, and
a second active signal generation unit that is configured to generate the refresh active signal according to the precharge signal and the refresh standby signal.

29. The active cycle control circuit of claim 28,
wherein the first active signal generation unit includes:
a first inverter that is configured to receive the precharge signal and to produce an output,
a first transistor that has a drain, a source coupled to a power terminal and a gate, to which the output of the first inverter is input,
second and third transistors that have drains commonly coupled to the drain of the first transistor, sources coupled to ground, and gates, to which the refresh active signal and the row active signal are input, respectively;
a first latch that has second and third inverters and is configured to receive a voltage level at the drain of the first transistor and to produce an output,
a fourth inverter that is configured to receive the output of the first latch and to produce an output,
a first NAND gate that is configured to receive the output of the fourth inverter and the delayed ready signal and to produce an output,
a fifth inverter that is configured to receive, the output of the first NAND gate and to produce an output,
a second latch that has sixth and seventh inverters and is configured to receive the output of the fifth inverter and to produce an output, an eighth inverter that is configured to receive the output of the second latch and output a normal active signal, a first delay unit that is configured to receive the normal active signal and to produce an output, a first pulse generation unit that is configured to receive the output of the first delay unit and output the row active signal, and a second pulse generation unit that is configured to receive the normal active signal and output the ready reset signal.

30. The active cycle control circuit of claim 28, wherein the second active signal generation unit includes:

a NAND gate that is configured to receive the latched value of the precharge signal and the refresh standby signal and to produce an output, a first inverter that is configured to receive the output of the NAND gate and to produce an output, a delay unit that is configured to receive the output of the first inverter and to produce an output, a latch that has second and third inverters and is configured to receive the output of the delay unit and to produce an output, a fourth inverter that is configured to receive the output of the latch and to produce an output, and a pulse generation unit that is configured to receive the output of the fourth inverter and output the refresh active signal.

31. An active cycle control circuit for a semiconductor memory apparatus comprising:

precharging an activated word line according to the read cycle and activating a word line corresponding to the refresh request signal so as to perform a refresh operation when a refresh request signal is enabled during a read or write cycle; and precharging the word line corresponding to the refresh operation and activating a word line according to the read cycle after the refresh operation is performed.

32. The active cycle control method of claim 31, wherein the precharging of the activated word line according to the read cycle and activating of the word line corresponding to the refresh request signal so as to perform the refresh operation comprises precharging a currently activated word line using a refresh active control signal generated at a timing at which the refresh request signal is generated and activating the word line corresponding to the refresh request signal so as to perform the refresh operation.

33. The active cycle control method of claim 32, further comprising generating the refresh active control signal at a same cycle as the refresh request signal.

34. The active cycle control method of claim 32, further comprising generating the refresh active control signal at a timing earlier than the refresh request signal.

35. An active cycle control circuit for a semiconductor memory apparatus comprising:

generating a refresh request signal at a predetermined cycle;

generating a refresh active control signal based on a timing at which the refresh request signal is generated;

precharging a currently activated word line using the refresh active control signal and activating a word line corresponding to the refresh request signal so as to perform a refresh operation when the refresh request signal is enabled during a read cycle; and precharging the word line corresponding to the refresh operation and activating a word line according to the read cycle after the refresh operation is performed.

36. The active cycle control method of claim 35, further comprising generating the refresh active control signal at a timing earlier than the refresh request signal.

37. The active cycle control method of claim 35, further comprising generating the refresh active control signal at a same cycle as the refresh request signal.

* * * * *